(12) United States Patent
Sasaki et al.

(10) Patent No.: US 7,777,350 B2
(45) Date of Patent: Aug. 17, 2010

(54) SEMICONDUCTOR STACK PACKAGE HAVING WIRING EXTENSION PART WHICH HAS HOLE FOR WIRING

(75) Inventors: Dai Sasaki, Tokyo (JP); Mitsuaki Katagiri, Tokyo (JP); Satoshi Isa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 77 days.

(21) Appl. No.: 12/219,839

(22) Filed: Jul. 29, 2008

(65) Prior Publication Data

US 2009/0032973 A1 Feb. 5, 2009

(30) Foreign Application Priority Data

Jul. 31, 2007 (JP) .......................... P2007-199695

(51) Int. Cl.
  *H01L 23/52* (2006.01)
  *H01L 23/48* (2006.01)
  *H01L 29/40* (2006.01)
  *H01L 23/02* (2006.01)
  *H01L 27/146* (2006.01)
  *H01L 27/148* (2006.01)

(52) U.S. Cl. ........................ 257/777; 257/686; 257/784; 257/E27.137; 257/E27.144; 257/E27.161

(58) Field of Classification Search ................. 257/686, 257/777, 784, E27.137, E27.144, E27.161
See application file for complete search history.

(56) References Cited

U.S. PATENT DOCUMENTS

| | | | |
|---|---|---|---|
| 5,719,436 A | 2/1998 | Kuhn | |
| 6,472,736 B1 * | 10/2002 | Yeh et al. | 257/686 |
| 6,545,366 B2 * | 4/2003 | Michii et al. | 257/777 |
| 6,555,919 B1 * | 4/2003 | Tsai et al. | 257/777 |
| 6,894,381 B2 * | 5/2005 | Hetzel et al. | 257/686 |
| 7,190,061 B2 * | 3/2007 | Lee | 257/686 |
| 7,504,284 B2 * | 3/2009 | Ye et al. | 438/109 |
| 2003/0124766 A1 * | 7/2003 | Kim et al. | 438/106 |
| 2005/0001305 A1 * | 1/2005 | Kyung | 257/686 |
| 2005/0104182 A1 * | 5/2005 | Kim | 257/686 |

FOREIGN PATENT DOCUMENTS

| | | |
|---|---|---|
| JP | 11-502063 | 2/1999 |
| JP | 11-163255 | 6/1999 |
| JP | 11-289043 | 10/1999 |
| JP | 2001-85609 | 3/2001 |

* cited by examiner

*Primary Examiner*—Luan C Thai
(74) *Attorney, Agent, or Firm*—McGinn IP Law Group, PLLC

(57) ABSTRACT

A semiconductor stack package includes a first printed wiring board; a plurality of semiconductor chips stacked on the first printed wiring board, wherein among the semiconductor chips, the uppermost semiconductor chip has an electrode pad for providing power supply, a ground pad for providing grounding, and a signal pad for signal transmission in a center area on the upper surface of the chip; connection lands formed on the first printed wiring board on the outside of the stacked semiconductor chips; a wiring extension part which is formed on the uppermost semiconductor chip, and has wiring circuits extending from the center to the periphery thereof, wherein at least one of the electrode pad and the ground pad is electrically connected to one end of one of the wiring circuits; and a wire for connecting the other end of the relevant wiring circuit of the wiring extension part and one of the connection lands on the first printed wiring board.

18 Claims, 14 Drawing Sheets

SEMICONDUCTOR STACK PACKAGE HAVING WIRING EXTENSION PART WHICH HAS HOLE FOR WIRING

BACKGROUND OF THE INVENTION

1. Field of the Invention

The present invention relates to a semiconductor stack package which can operate at a high speed by noise reduction.

Priority is claimed on Japanese Patent Application No. 2007-199695, filed Jul. 31, 2007, the contents of which are incorporated herein by reference.

2. Description of the Related Art

In a known structure of semiconductor stack packages, semiconductor chips or semiconductor packages are stacked. In accordance with recent improvements in high-density packaging, further size-reduction or thing is required, and various structures for stacking semiconductor chips have been proposed by manufacturing companies.

In the semiconductor chip structure of a first known example of semiconductor stack chips, two semiconductor chips are stacked in a manner such that the back faces thereof face each other. A lead frame is provided at each of the upper and lower faces of the relevant stack structure, and the circuits of each semiconductor chip and the corresponding lead frame are connected by means of bonding, wherein the upper and lower lead frames branch from a single lead (see Patent Document 1).

In the stack package of a second known example of semiconductor stack chips, two semiconductor chips are integrated in a manner such that back faces thereof face each other, and the integrated body is embedded in a sealing material. A printed substrate layer is also embedded in the sealing material, where it separates from the printed substrate layer and semiconductor chips. The printed substrate layer is connected to an external lead, and the printed substrate layer and bonding pads of the semiconductor chips are connected to each other via bonding lines, so as to strengthen GND lines and power supply lines (see Patent Document 2).

In the semiconductor chip stack structure of a third known example of semiconductor stack chips, a first semiconductor chip and a second semiconductor chip are stacked via a paddle in which a flexible circuit is stacked on each of the upper and lower surfaces thereof. Terminals of each chip are connected to the relevant flexible circuit, and also connected to external leads by using long wires (see Patent Document 3).

In another known semiconductor chip structure in which upper and lower semiconductor chips are stacked on a printed wiring (or circuit) board, the circuit face of the lower semiconductor chip faces downward (i.e., faces the printed wiring board) while the upper semiconductor chip faces upward. Pads of the lower semiconductor chip are connected via wires to the lower face (i.e., opposite to the face on which the semiconductor chips are stacked) of the printed wiring board (see Patent Document 4).

FIG. 15 shows another generally-known example of semiconductor chip stack structures. In the structure, a spacer 102 is provided between upper and lower semiconductor chips 100a and 100b which are stacked on a printed wiring board 103. As electrode pads 104a and 104b of the semiconductor chips 100a and 100b are provided at periphery ends thereof, the pads can be connected to connection lands 103a on the printed wiring board 103 (on which the semiconductor chips 100a and 100b are provided) via relatively short wires 105. However, in a device in which electrode pads are arranged at the center of the relevant semiconductor chip (e.g., a general-purpose DRAM (dynamic random access memory)), a long wire is arranged from each electrode pad at the center of the chip to the outside of the chip, so as to connect the electrode pad to the corresponding connection land 103a of the relevant printed wiring board 103. Therefore, no spacer 102 as shown in FIG. 15 can be provided.

FIGS. 16A and 16B show examples of chip stack structures, in which electrode pads are provided at the center of the relevant semiconductor chips.

In the structure shown in FIG. 16A, semiconductor chips 108a and 108b are stacked on a printed wiring board 107 while they are surrounded by a sealing material 109. In addition to pads for signal transmission of the semiconductor chips 108a and 108b, electrode pads 110a and 110b for providing power supply and grounding are also connected to connection lands 107b, which are provided at a peripheral area of the printed wiring board 107, via long wires 112a and 112b.

In the structure shown in FIG. 16B, semiconductor chips 115a and 115b are stacked on a printed wiring board 116. The circuit face of the lower semiconductor chip 115a faces downward, while the circuit face of the upper semiconductor chip 115b faces upward. The printed wiring board 116 has a through-hole 118 in which electrode pads 115c of the lower semiconductor chip 115a are positioned. In this structure, the electrode pads 115c are connected via the through-hole 118 to connection lands 116a, which are provided on the back face of the printed wiring board 116, by using short wires 117a, where wiring lines of circuits on the printed wiring board 116 are thicker than the diameter of each wire 117a.

Patent Document 1: Japanese Unexamined Patent Application, First Publication No. H11-163255.

Patent Document 2: Japanese Unexamined Patent Application, First Publication No. H11-289043.

Patent Document 3: Published Japanese Translation, No. H11-502063, of PCT International Publication, No. WO96/28860.

Patent Document 4: Japanese Unexamined Patent Application, First Publication No. 2001-85609.

In each upper semiconductor chip (108b or 115b) of the chip stack structures shown in FIGS. 16A and 16B, not only pads for transmitting signals and also electrode pads for providing power supply and grounding are connected to the connection lands (107a or 116b) provided on the printed wiring board (107 or 116) via long wires (112b or 117b). Therefore, the relevant inductance and resistance (i.e., LR) increase, which may cause noises or voltage drops, and prevent high-speed operation.

Also in the structure disclosed in Patent Document 4, electrode pads of the upper semiconductor chip are connected to connection lands, which are provided at the periphery of the relevant printed wiring board, via long wires. Therefore, the inductance and resistance of the power supply and grounding increase, which may cause noises or voltage drops, and prevent high-speed operations.

SUMMARY OF THE INVENTION

In light of the above circumstances, an object of the present invention is to provide a semiconductor stack package in which bonding-connection parts using long wires are considerably reduced, and connection of pads for power supply and grounding can be performed using wiring circuits which have a wiring width thicker than the relevant wire diameter, so as to reduce wiring impedance and remove factors for noises or voltage drops, thereby implementing high-speed operation with low noise.

Therefore, the present invention provides a semiconductor stack package comprising:

a first printed wiring board;

a plurality of semiconductor chips stacked on the first printed wiring board, wherein among the semiconductor chips, the uppermost semiconductor chip has an electrode pad for providing power supply, a ground pad for providing grounding, and a signal pad for signal transmission in a center area on the upper surface of the chip;

connection lands formed on the first printed wiring board on the outside of the stacked semiconductor chips;

a wiring extension part which is formed on the uppermost semiconductor chip, and has wiring circuits extending from the center to the periphery thereof, wherein at least one of the electrode pad and the ground pad is electrically connected to one end of one of the wiring circuits; and a wire for connecting the other end of the relevant wiring circuit of the wiring extension part and one of the connection lands on the first printed wiring board.

Preferably, the wiring extension part has a wiring hole in a center area thereof.

In accordance with the above structure, the pad for power supply or grounding of the uppermost semiconductor chip can be connected to the wiring extension part via a short wire, and can be further connected to the periphery of the wiring extension part via the wiring circuit formed on the wiring extension part while maintaining a low impedance. In addition, the periphery of the wiring extension part and the corresponding connection land on the first printed wiring board can be connected to each other via a short wire. Therefore, wiring can be provided with a low impedance, even between the uppermost semiconductor chip, on which a pad for power supply or grounding is provided, and the first printed wiring board. Accordingly, in comparison with conventional semiconductor stack packages in which connection to the relevant connection land on the first printed wiring board is performed via a long wire, the impedance of the inner-connection wiring can be low, and the semiconductor stack package can operate at a high speed by noise reduction.

In a typical example, the electrode pad and the ground pad of the uppermost semiconductor chip are each connected to the center side of one of the wiring circuits via a wire, which passes through the wiring hole, by means of bonding. Accordingly, the electrode pad and the ground pad of the uppermost semiconductor chip each can be connected to the center side of one of the wiring circuits via a short wire. Therefore, the relevant wiring can have a low impedance, thereby implementing high-speed operation with low noise.

In a preferable example, the wiring extension part is formed using a second printed wiring board which has a substrate, a wiring hole provided in a center area of the substrate, and wiring circuits which extend from the wiring hole to the periphery of the substrate. In such a second printed wiring board, the width of each wiring circuit can be large, thereby reducing the impedance and implementing high-speed operation with low noise.

In another typical example, the wiring extension part has an insulating layer, wiring layers, and connection lands, which are deposited on the uppermost semiconductor chip, so that the wiring extension part is integrally formed on the uppermost semiconductor chip and the uppermost semiconductor chip functions as a chip size package. That is, instead of the relevant wire connection, the wiring layers and connection lands used in a CSP (chip size package) form may be employed so as to reduce the impedance and implement high-speed operation with low noise.

In another typical example:

the plurality of semiconductor chips include first and second semiconductor chips, each of which has an electrode pad for providing power supply, a ground pad for providing grounding, and a signal pad for signal transmission, where the pads are provided on a center part of one face thereof, and the other face forms a flat part; and the first and second semiconductor chips are stacked on the first printed wiring board in a manner such that the second semiconductor chip functions as the uppermost semiconductor chip.

In this case, preferably:

the first printed wiring board has a wiring connection hole;

the first semiconductor chip is stacked on the first printed wiring board in a manner such that the electrode pad, the ground pad, and the signal pad, which are provided on the center part of the one face of the first semiconductor chip, are contained in the wiring connection hole; and the second semiconductor chip is stacked on the first semiconductor chip in a manner such that the flat parts of the first and second semiconductor chips face each other.

In this case, it is possible that:

on the back face of the first printed wiring board, a connection land is provided in the vicinity of the wiring connection hole; and at least one of the electrode pad, the ground pad, and the signal pad of the first semiconductor chip, which are contained in the wiring connection hole, is connected to the connection land in the vicinity of the wiring connection hole, via a wire by means of bonding.

Accordingly, the electrode pad or the ground pad of the first semiconductor chip can be connected via the wiring connection hole to the relevant connection land on the first printed wiring board, by using a short wire. Therefore, the wiring of the first semiconductor chip can have a low impedance, and the first semiconductor chip can operate at a high speed by noise reduction.

In another typical example, the signal pad of the uppermost semiconductor chip is connected to one of the connection lands on the first printed wiring board via a wire by means of bonding, where the wire passes above and beside the wiring extension part and the wiring hole thereof. Accordingly, the connection of the signal pad is performed using a long wire, and it is difficult to reduce the relevant impedance. However, in comparison with the wiring for the signal pad, low impedance of the wiring with respect to the electrode and ground pads can more contribute to a high-speed operation of the relevant semiconductor chip.

On the back face of the first printed wiring board, conductive elements may be provided and electrically connected to the connection lands which are formed on the front face of the printed wiring board and on the outside of the stacked semiconductor chips.

The conductive elements may be solder balls.

It is possible that the connection land on the first printed wiring board, which is provided in the vicinity of the wiring connection hole, and the wire connected to this connection land are covered with a sealing material.

In another typical example, on the front face of the first printed wiring board, a sealing part is provided so as to cover the connection lands on the first printed wiring board, the semiconductor chips stacked on the first printed wiring board, the wiring extension part, and the wires connected therebetween by means of bonding.

In another typical example:

the wiring extension part is provided via an insulating layer on the uppermost semiconductor chip; and the signal pad of the uppermost semiconductor chip is connected to one of the connection lands on the first printed wiring board via a wire which passes through the insulating layer and extends along the side of the uppermost semiconductor chip.

In another typical example:

the plurality of semiconductor chips include a first semiconductor chip in which a face, on which pads are formed, faces the first printed wiring board, and the pads are connected to connection lands provided on the first printed wiring board; and a second semiconductor chip, which functions as the uppermost semiconductor chip, is stacked on the first semiconductor chip.

In another typical example, the semiconductor stack package further comprises:

another wiring extension part formed on one of the semiconductor chips which is positioned lower than the uppermost semiconductor chip, wherein said another wiring extension part has wiling circuits extending from the center to the periphery thereof, the lower-positioned semiconductor chip has an electrode pad for providing power supply and a ground pad for providing grounding, and at least one of the electrode pad and the ground pad is electrically connected to one end of one of the wiring circuits; and a wire for connecting the other end of the relevant wiring circuit of said another wiring extension part and one of the connection lands on the first printed wiring board, wherein:

the uppermost semiconductor chip is stacked on the lower-positioned semiconductor chip via an insulating layer which is formed on said another wiring extension part.

As described above, in accordance with the present invention, the connection wiring of an electrode pad for providing power supply or a ground pad for providing grounding of the uppermost semiconductor chip can have a low impedance. Therefore, it is possible to provide a semiconductor stack package which can operate at a high speed by noise reduction.

BRIEF DESCRIPTION OF THE DRAWINGS

FIGS. 2A and 2B show the method of manufacturing the semiconductor stack package of the first embodiment, wherein FIG. 2A is a sectional view showing a state in which a first semiconductor chip is stacked on a first printed wiring board, and FIG. 2B is a relevant perspective view.

FIGS. 3A and 3B also show the method of manufacturing the semiconductor stack package, wherein FIG. 3A is a sectional view showing a state in which pads of the first semiconductor chip are connected to the first printed wiring board by means of wire bonding, and FIG. 3B is a relevant perspective view.

FIGS. 5A and 5B also show the method of manufacturing the semiconductor stack package, wherein FIG. 5A is a sectional view showing a state in which a wiring extension part is provided on the second semiconductor chip, and FIG. 5B is a relevant perspective view.

FIGS. 6A and 6B also show the method of manufacturing the semiconductor stack package, wherein FIG. 6A is a sectional view showing a state in which pads of the second semiconductor chip are connected to connection pads of the wiring extension part by means of wire bonding, and FIG. 6B is a relevant perspective view.

FIGS. 7A and 7B also show the method of manufacturing the semiconductor stack package, wherein FIG. 7A is a sectional view showing a state in which pads of the second semiconductor chip are connected to connection lands of the first printed wiring board by mews of wire bonding, and FIG. 7B is a relevant perspective view.

FIGS. 12A and 12B show the method of manufacturing a semiconductor stack package as a fifth embodiment of the present invention, wherein FIG. 12A is a sectional view showing a state in which a wiring extension part is stacked on a second semiconductor chip, and FIG. 12B is a relevant perspective view.

FIGS. 13A and 13B also show the, method of manufacturing the semiconductor stack package, wherein FIG. 13A is a sectional view showing a state in which the second semiconductor chip and the wiring extension part are stacked on a first semiconductor chip, and FIG. 13B is a relevant perspective view.

FIGS. 14A and 14B also show the method of manufacturing the semiconductor stack package, wherein FIG. 14A is a sectional view showing a state in which the second semiconductor chip and the wiring extension part are subjected to bonding connection, and FIG. 14B is a relevant perspective view.

DETAILED DESCRIPTION OF THE INVENTION

Hereinafter, embodiments as best modes of the present invention will be described with reference to the appended figures.

Figure 1:
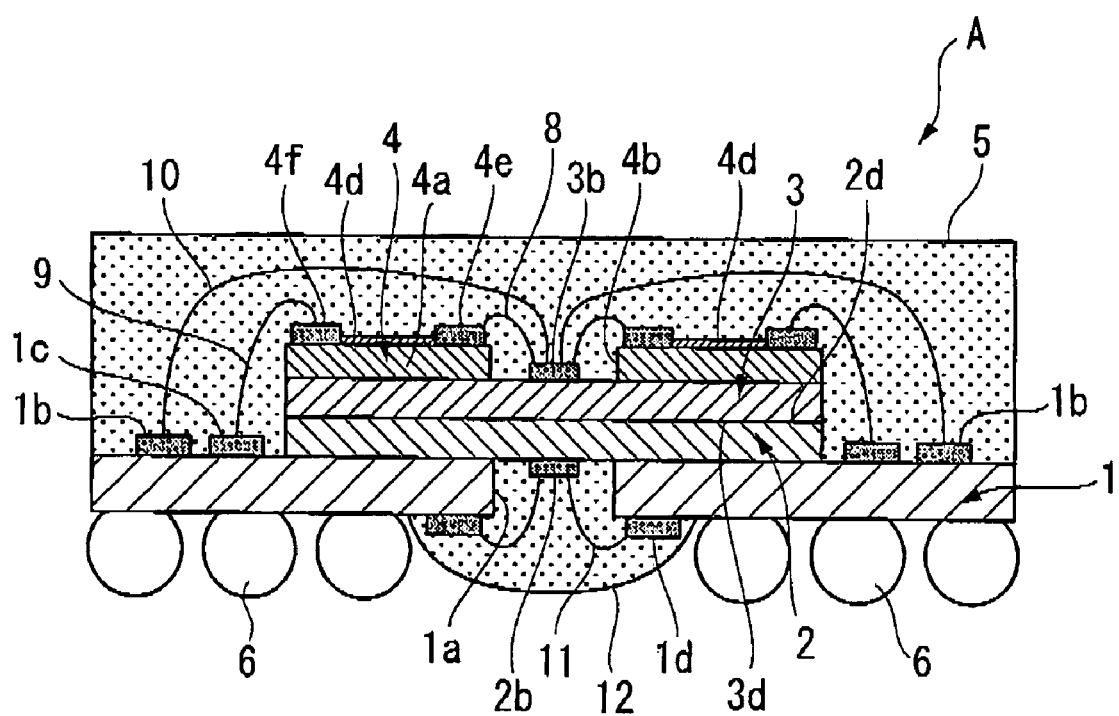
FIG. 1 is a longitudinal sectional view showing a first embodiment of the semiconductor stack package of the present invention.

FIG. 1 is a longitudinal sectional view showing a first embodiment of the semiconductor stack package of the present invention, and FIGS. 2A to 7B are diagrams for explaining the manufacturing processes thereof. FIG. 8 is a plan view showing an example of a wiring extension part. In FIG. 8, "DQ signal" indicates a signal relating to data output, and "CA signal" indicates a command/address signal.

As shown in FIG. 1, in a semiconductor stack package A of the first embodiment, on a center area of a first printed wiring board 1 having a rectangular form in plan view, a first semiconductor chip 2, a second semiconductor chip 3, and a second printed wiring board 4 (as a wiring extension part) are stacked, where each stacked element also has a rectangular form in plan view. A sealing part 5 made of molded resin is also provided on the first printed wiring board 1 so as to cover the above stacked elements. In addition, a plurality of solder balls 6 are provided on the lower surface of the first printed wiring board 1.

At the center of the first printed wiring board 1, a wiring connection hole 1a having a slit form is provided, and a plurality of connection lands 1b are formed in a peripheral area on the upper surface of the first printed wiring board 1. A plurality of connection lands 1d are also provided at the center on the back face of the first printed wiring board 1, that is, at the periphery of the wiring connection hole 1a. In the first printed wiring board 1, inner wiring and the like for connecting each of the connection lands 1b and 1d to any solder ball 6 is provided (detailed structures thereof are omitted in FIG. 1).

A plurality of pads 2b are provided on the first semiconductor chip 2 in a manner such that they face downward, and are arranged in the wiring connection hole 1a of the first printed wiring board 1.

The second semiconductor chip 3 has a structure similar to that of the first semiconductor chip 2. That is, the second semiconductor chip 3, stacked on the first semiconductor chip 2, has a plurality of pads 3b which are provided on the second semiconductor chip 3 and face upward. In the semiconductor chips 2 and 3, the faces where no pad is arranged are flat parts 2d and 3d. Therefore, in the structure of FIG. 1, the second semiconductor chip 3 closely contacts the first semiconductor chip 2.

On the second semiconductor chip 3, the wiring extension part 4 (i.e., the second printed wiring board) is stacked, which has a rectangular form in plan view (i.e., similar to the second semiconductor chip 3). At the center of a substrate 4a of the wiring extension part 4, a wiring hole 4b having a slit form is provided, so that the pads 3b of the second semiconductor chip 3 are arranged in this hole. In other words, the wiring extension part 4 is stacked on the second semiconductor chip 3 in a manner such that each pad 3b is contained in the wiring hole 4b.

FIG. 8 shows an example of the wiring extension part 4, in which the wiring hole 4b having a slit form extends in the vertical direction at the center of the substrate 4a In FIG. 8, a plurality of pads 3b (e.g., 29 pads) are provided in the wiring hole 4b.

In the shown example, almost half of the 29 pads 3b are used for signal transmission. The other pads are used for providing power supply or grounding.

Additionally, in the example of FIG. 8, wiring circuits 4d1 and 4d2, each having a strip shape, are alternately arranged on both sides of the wiring hole 4b (having a slit shape) on the upper surface of the substrate 4a, in a manner such that four wiring circuits 4d1 and four wiring circuits 4d2 are alternately arranged, thereby providing 8 wiring circuits on either side, and totally providing 16 wiring circuits along two rows. Here, the 8 wiring circuits are formed for each row so as to establish wiring of all pads used for providing power supply and grounding, and the number of the wiring circuits 4d is not limited.

More specifically, in FIG. 8, each wiring circuit 4d1 is assigned to each pad for power supply (e.g., VDD, or VDDQ), while each wing circuit 4d2 (see the dotted parts) is assigned to each pad for ground (e.g., VSS, or VSSQ). In the example of FIG. 8, the wiring extension part 4 (the second printed wiring board) is a one-side substrate in which Cu foils are deposited on one side of the substrate.

Among the 29 pads 3b on the semiconductor chip 3, 16 pads 3b for power supply and grounding are connected to the relevant ends of the corresponding wiring circuits 4d1 and 4d2 via wires 8 by means of bonding. In addition, in each of the relevant wiring circuits 4d1 and 4d2, the end opposite to the end to which the wire 8 is connected is connected to a connection land 1c (on the outside of the corresponding wiring circuit) of the printed wiring board 1 via a wire 9 by means of wire bonding. Additionally, in each of the wiring circuits 4d1 and 4d2 on the wiring extension part 4 of FIG. 8, (i) a connection land 4e is formed at the end toward the wiring hole 4b, and (ii) a connection land 4f is formed at the end toward the peripheral edge of the wiring extension part 4. To each of the connection lands 4e and 4f, the wire 8 or 9 is connected.

As the remaining 13 pads of the semiconductor chip 3b are used for signal transmission, they are connected to the corresponding connection pads 1b via relatively long wires 10 by means of wire bonding. Each wire 10 passes above and beside the wiring hole 4b and the wiring extension part 4, and reaches the corresponding connection pad 1b on the first printed wiring board 1. In FIG. 8, each wire 10 is indicated by a chain line.

As described above, the plurality of pads 2b of the first semiconductor chip 2 are provided in the wiring connection hole 1a (having a slit form) of the first printed wiring board 1. On the back face of the first printed wiring board 1, the plurality of the connection lands 1d are provided around the wiring connection hole 1a. To the connection lands 1d, the pads 2b of the first semiconductor chip 1 are connected by means of wire bonding using wires 11, and a sealing part 12 covers the relevant connection parts and their periphery, that is, the inside of the wiring connection hole 1a, the wires 11, and the pads 2b and 1d, and their nearby area.

In the semiconductor stack package A having the above-described structure, each wire 8 passes through the wiring hole 4b and connects the relevant pad 3b and the nearby end of the corresponding wiring circuit 4d (having a slit form) to each other via a short distance, that is, the wire 8 can be short. In addition, each wire 9 connects the connection land 4f at the relevant end of the corresponding wiring circuit and the connection land 1c (of the first printed wiring board 1) in the vicinity thereof to each other via a short distance, that is, the wire 9 can also be short.

On the other hand, each wiring circuit (4d1 or 4d2) for connecting the relevant wires 8 and 9 to each other may be formed as a conductive layer whose width is sufficiently larger than the diameters (e.g., 25 μm) of the wires 8 and 9, thereby providing sufficiently low wiring impedance. In addition, not all of the pads 3b of the semiconductor chip 3 are connected to the wing circuits 4d1 or 4d2, but only the pads 3b for power supply and grounding, which relatively tend to be affected by high impedance, are connected to the wiring circuits 4d1 or 4d2. Therefore, the surface area of the wiring extension part 4 can be effectively used while impedance of each wiring circuit can be as low as possible.

As described above, the wires 8 and 9 can be as short as possible. Therefore, no increase in resistance occurs at the wires 8 and 9, or increase in impedance is small. Accordingly, as noises are not easily produced at the wires 8 and 9, voltage drops can be prevented, and high-speed operation of the second semiconductor chip 3 is not obstructed.

Next, with reference to FIGS. 2A to 7B, an example of the method for manufacturing the semiconductor stack package A shown in FIG. 1 will be explained.

Figure 2A:
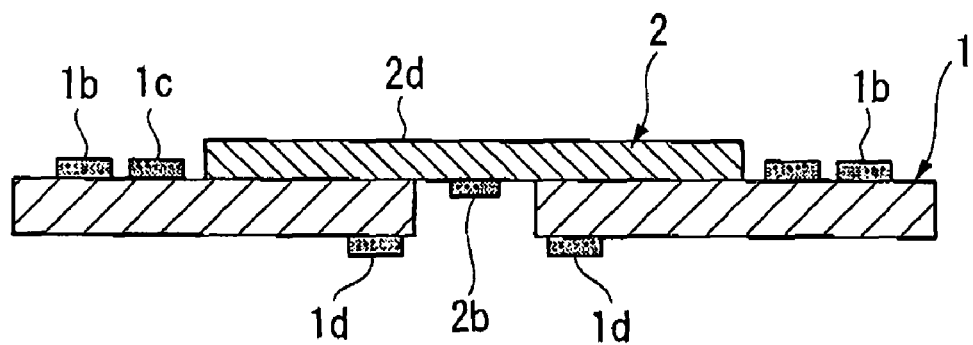

First, on the upper surface of the first printed wiring board 1, an insulating adhesive (not shown, e.g., epoxy resin or an elastomer material) is deposited in an area where the first semiconductor chip 2 will be disposed, and the first semiconductor chip 2 is disposed on the relevant center area of the first printed wag board 1 in a manner such that the circuit face (on which the pads 2b are formed) of the first semiconductor chip 2 faces downward. The insulating adhesive is then cured, so that the first semiconductor chip 2 is adhered to the first printed wiring board 1. FIG. 2A is a sectional view showing the adhered state.

Figure 2B:
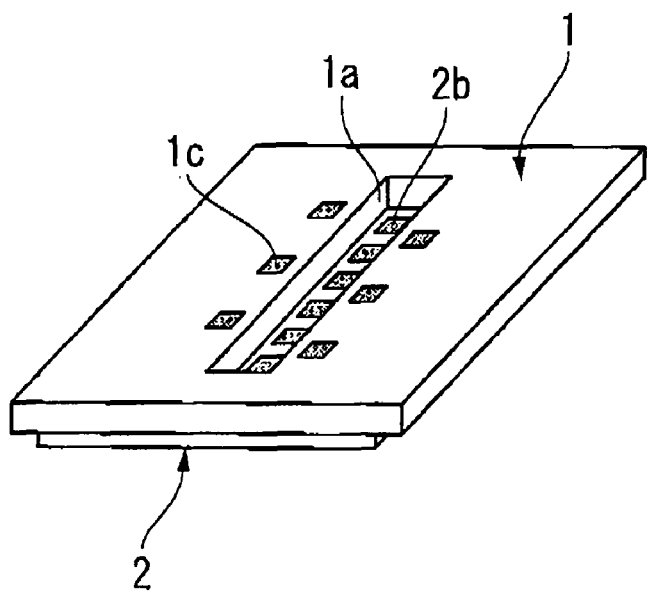

As shown in FIG. 2B, at the center of the first printed wiring board 1, the wiring connection hole 1a having a slit shape is formed, and the electrode pads 2b of the first semiconductor chip 2 are contained in the hole. In FIG. 2B, the adhered body is inverted so that the first semiconductor chip 2 faces downward, and the inverted body is observed from an upper-oblique direction.

Figure 3A:
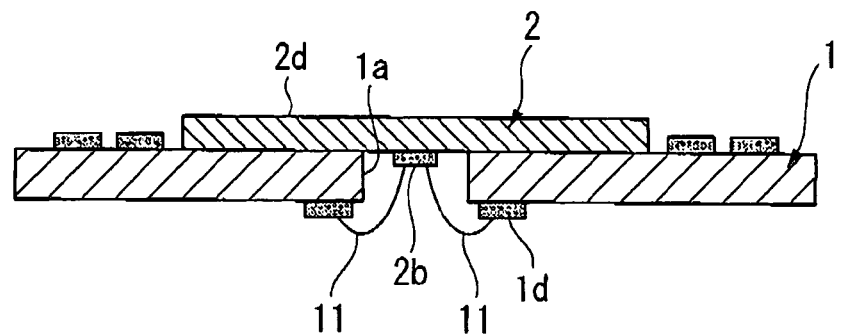
Figure 3B:
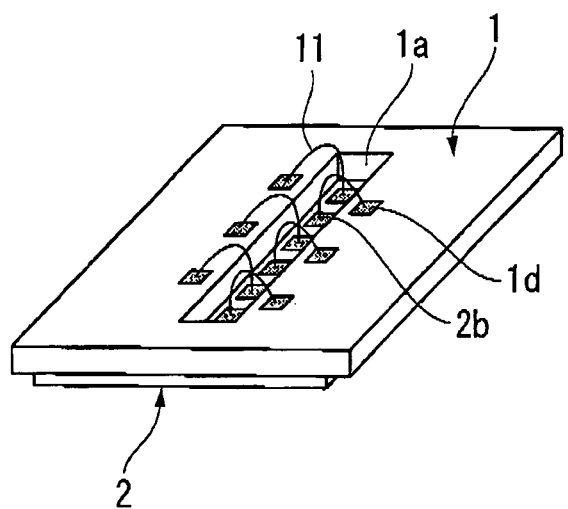

Next, as shown in FIGS. 3A and 3B, the wires 11, which may be made of Au, are connected via the wiring connection hole 1a by means of wire bonding, between the electrode pads 2b of the first semiconductor chip 2 and the connection lands 1d provided on the first printed wiring board 1, that is, on the back face thereof opposite to the face on which the first semiconductor chip 2 is disposed. FIG. 3A is a sectional view showing this state, and in FIG. 3B, the structural body is inverted so that the first semiconductor chip 2 faces downward, and the inverted body is observed from an upper-oblique direction.

Figure 4:
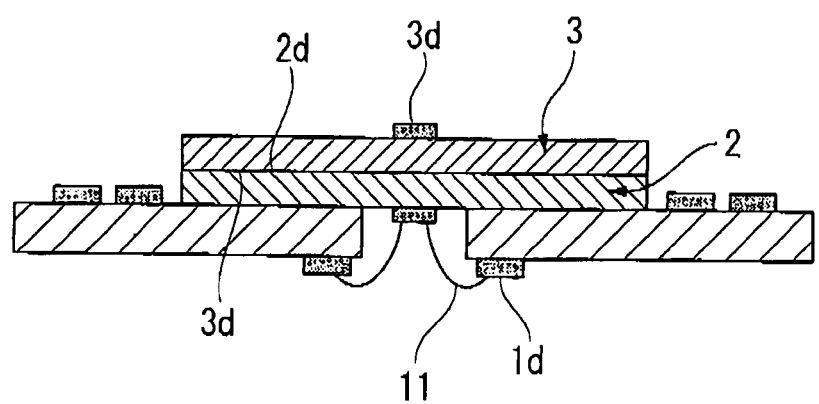
FIG. 4 also shows the method of manufacturing the semiconductor stack package, and is a sectional view showing a state in which a second semiconductor chip is stacked on the first semiconductor chip.

Next, on the first semiconductor chip 2, that is, the flat part 2d opposite to the circuit face, an insulating adhesive (not shown, e.g., epoxy resin or an elastomer material) is deposited, and the second semiconductor chip 3 is disposed thereon in a manner such that the circuit face of the second semiconductor chip 3 faces upward. Then the insulating adhesive is cured so that the first semiconductor chip 2 and the second semiconductor chip 3 are adhered to each other, and the flat part 2d of the first semiconductor chip 2 and the flat part 3d of the second semiconductor chip 3 closely contact each other. FIG. 4 is a sectional view showing this state.

Figure 5A:
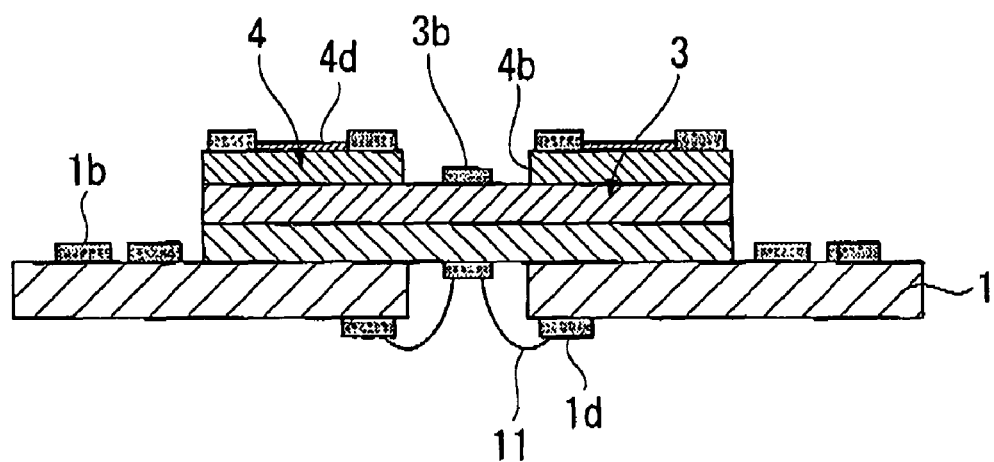
Figure 5B:
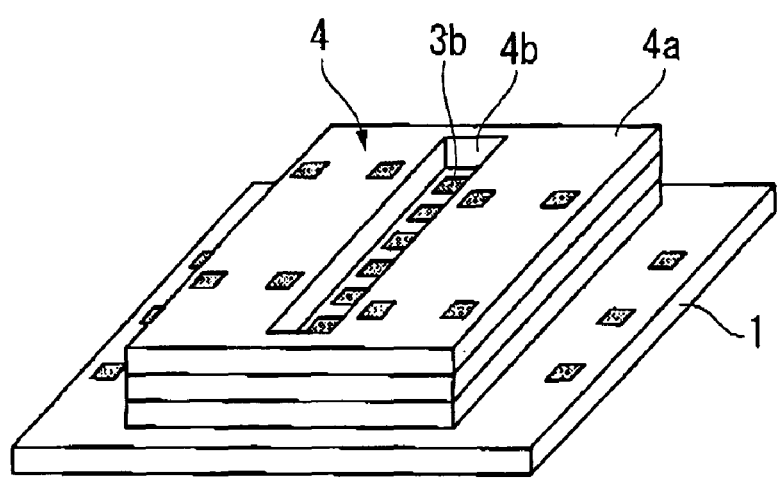

Next, on the second semiconductor chip 3, that is, the circuit face thereof, an insulating adhesive (not shown, e.g., epoxy resin or an elastomer material) is deposited in an area where the second printed wiring board 4 (i.e., the wiring extension part), on which only wiring circuits for power supply and grounding are formed, is stacked. Therefore, as shown in FIGS. 5A and 5B, the second printed wiring board 4 (on which only wiring circuits for power supply and grounding are formed) is stacked on (the circuit face of) the second semiconductor chip 3. The insulating adhesive is then cured, so that the second semiconductor chip 3 and the second printed wiring board 4 (on which only wiring circuits for power supply and grounding are formed) are adhered to each other.

As the wiring hole 4b having a slit shape is formed at the center of the second printed wiring board 4, the electrode pads 3b of the second semiconductor chip 3 are contained in the wiring hole 4b. FIG. 5A is a sectional view showing this state, and FIG. 5B is a view observed from an upper-oblique direction.

Figure 6A:
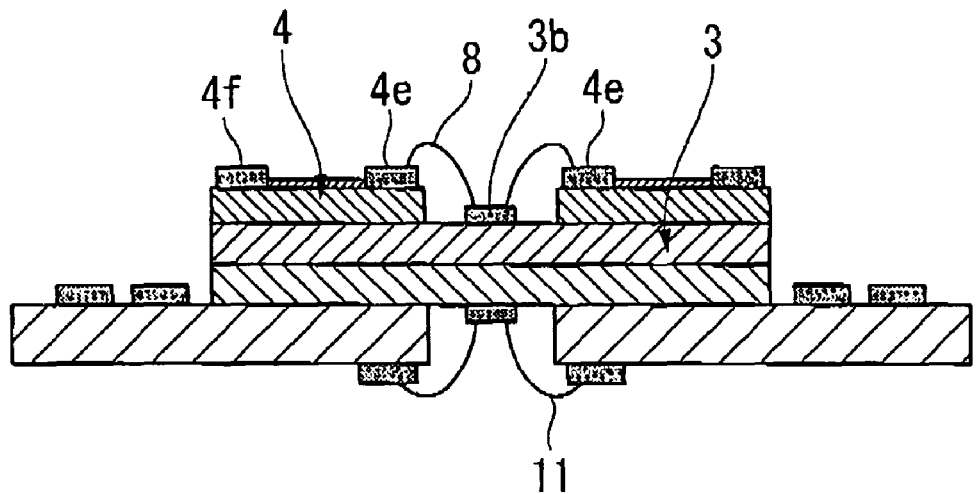
Figure 6B:
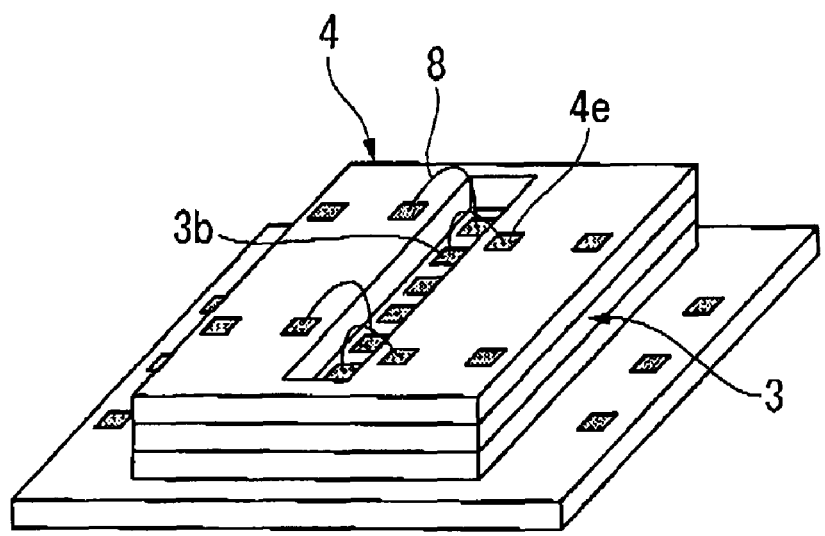

Next, as shown in FIGS. 6A and 6B, the wires 8, which may be made of Au, are connected between the electrode pads 3b for power supply and grounding of the second semiconductor chip 3 and the connection lands 4e of the second printed wiring board 4, on which only the wiring circuits for power supply and grounding are formed, by means of wire bonding. FIG. 6A is a sectional view showing this state, and FIG. 6B is a view observed from an upper-oblique direction.

Figure 7A:
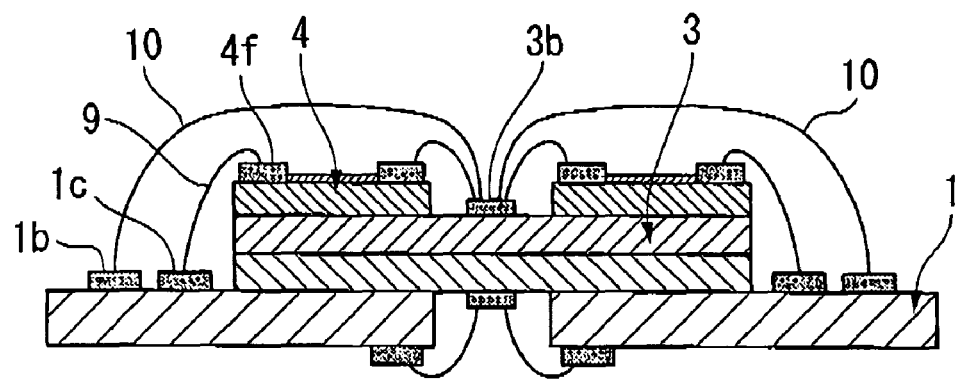
Figure 7B:
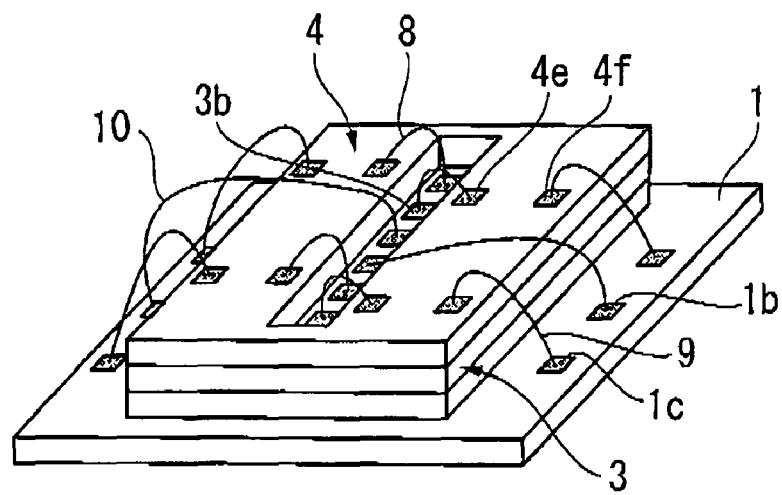
Figure 8:
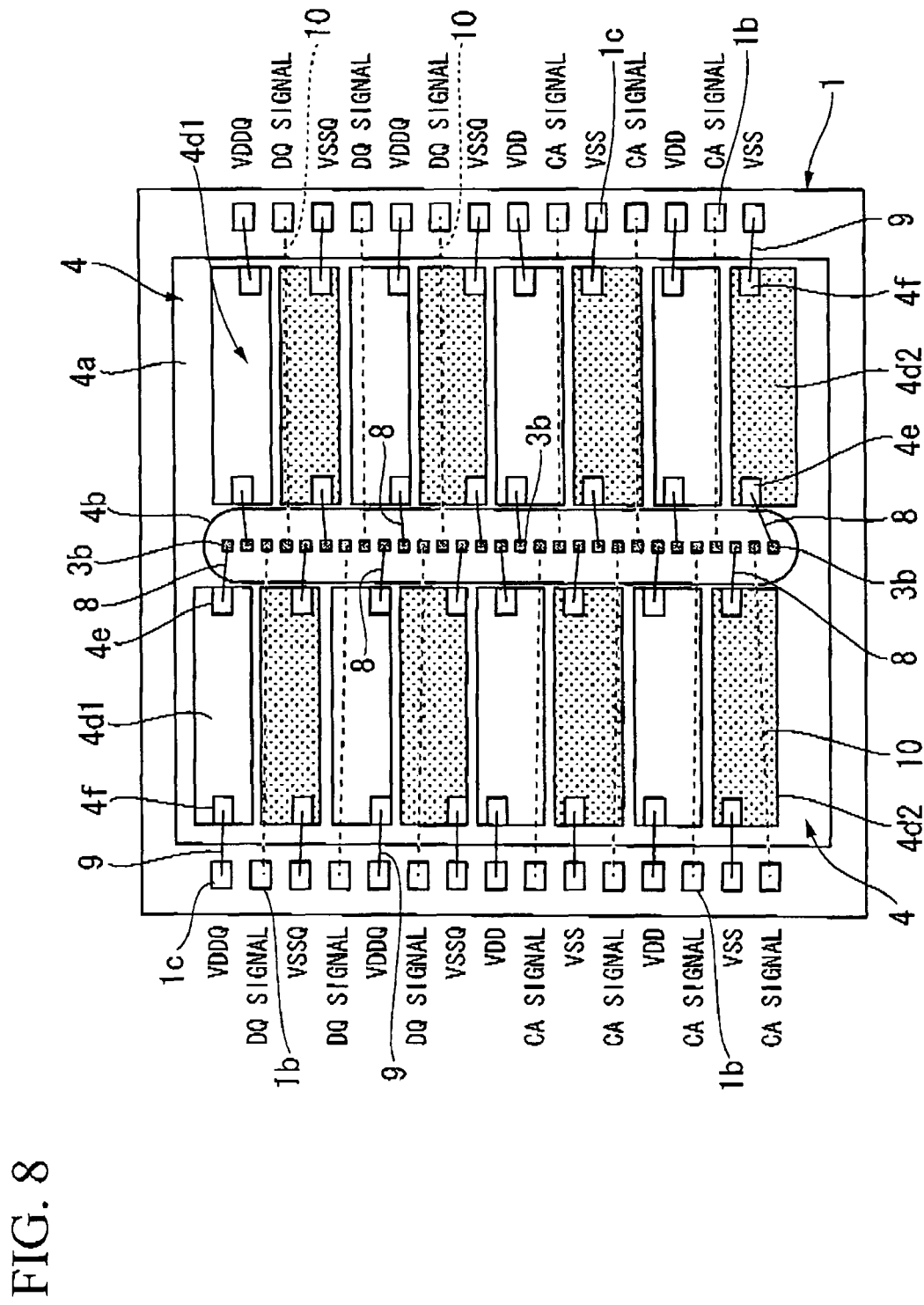
FIG. 8 is a plan view showing an example of the wiring extension part.

Next, as shown in FIGS. 7A and 7B, the wires 10, which may be made of Au, are connected between the electrode pads 3b for signal transmission of the second semiconductor chip 3 and the connection lands 1b of the first printed wiring board 1, via the wiring hole 4b of the second printed wiring board 4 (on which only the wiring circuits for power supply and grounding are formed) by means of wire bonding. Here, the wires 10 pass above and beside the wiring extension part 4, and reach the connection lands 1b.

In addition, the wires 9, which may be made of Au, are connected between the connection lands 4f, which are provided at the relevant ends of the second printed wiring board 4, and the above-described connection lands 1c of the first printed wiring board 1, by means of wire bonding.

In each sectional view such as FIG. 7A, the connection lands 1b and 1c are separately shown for convenience of explanations (that is, the connection land 1c is closer to the semiconductor chips, and the connection land 1b is positioned outside). However, the connection lands 1b and the connection lands 1c on each side of the wiring hole 4b may be arranged on a straight line (see FIG. 8). It is also preferable that the connection lands 1c for power supply and grounding are arranged close to the semiconductor chips, so that the wire length is further shortened. FIG. 7A is a sectional view showing the relevant state, and FIG. 7B is a view observed from an upper-oblique direction.

Lastly, as shown in FIG. 1, the sealing part 5 is formed using a mold material (e.g., epoxy resin) so as to seal up the first and second semiconductor chips 2 and 3, and the wires 8, 9, and 10, and cover the upper surface of the firs printed wiring board 1 and the semiconductor chips 2 and 3. In addition, the sealing part 12 is also formed by providing a mold material to the periphery of the wires 11 on the back side of the first printed wiring board 1. Additionally, the solder balls 6, which function as the electrodes of the present semiconductor package and may be made of Sn, Ag, or Cu, are formed, thereby finishing the semiconductor stack package A.

Figure 9:
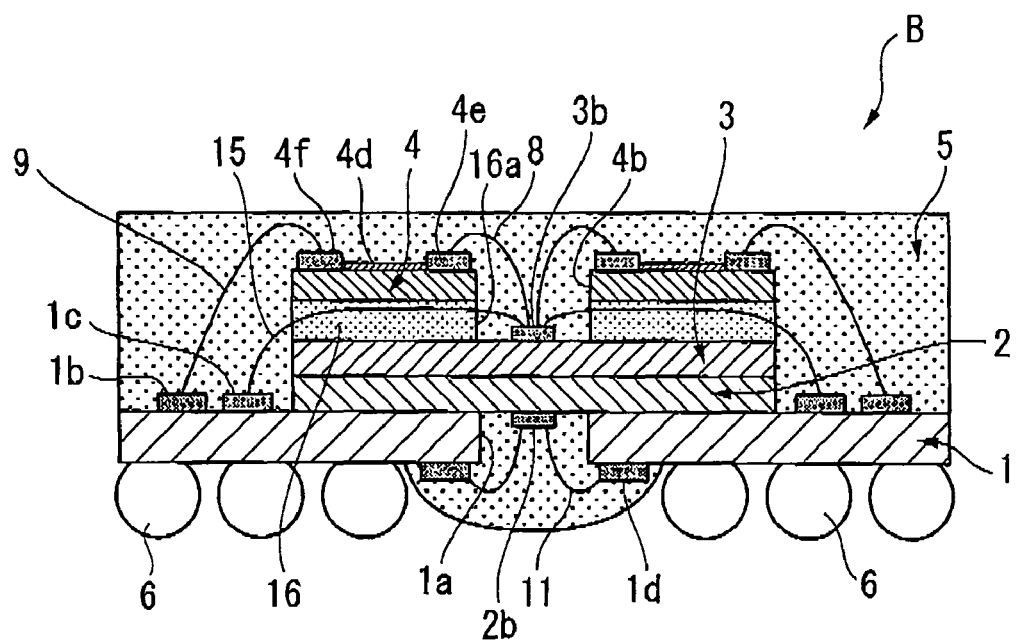
FIG. 9 is a longitudinal sectional view showing a second embodiment of the semiconductor stack package of the present invention.

FIG. 9 shows a second embodiment of the present invention. As shown in FIG. 9, in a semiconductor stack package B of the present embodiment, wires 15 are connected between the pads 3b for signal transmission of the second semiconductor chip 3 and the connection lands 1c of the first printed wiring board 1 by means of wire bonding, before the wiring extension part 4 is stacked. On the circuit face of the second semiconductor chip 3, an insulating layer is formed by providing an insulating adhesive 16 (as an insulating layer which may be made of epoxy resin) so that the wires 15 are embedded. That is, the wiring extension part 4 is stacked on the wires 15 and the insulating adhesive 16.

On the second semiconductor chip 3, the insulating adhesive 16 is provided except for an area where the pads 3b are formed. That is, on the second semiconductor chip 3, the pads 3b are contained below the wiring hole 4b of the wiring extension part 4, via a through-hole part 16a where no insulating adhesive 16 is provided. In addition, the through-hole part 16a is filled with a mold material, that is, protected by a sealing material. In FIG. 9, the other parts are identical to the corresponding parts of the semiconductor stack package A of the first embodiment.

Similar effects to those obtained by the previous embodiment can be obtained by the structure of the present embodiment.

Figure 10:
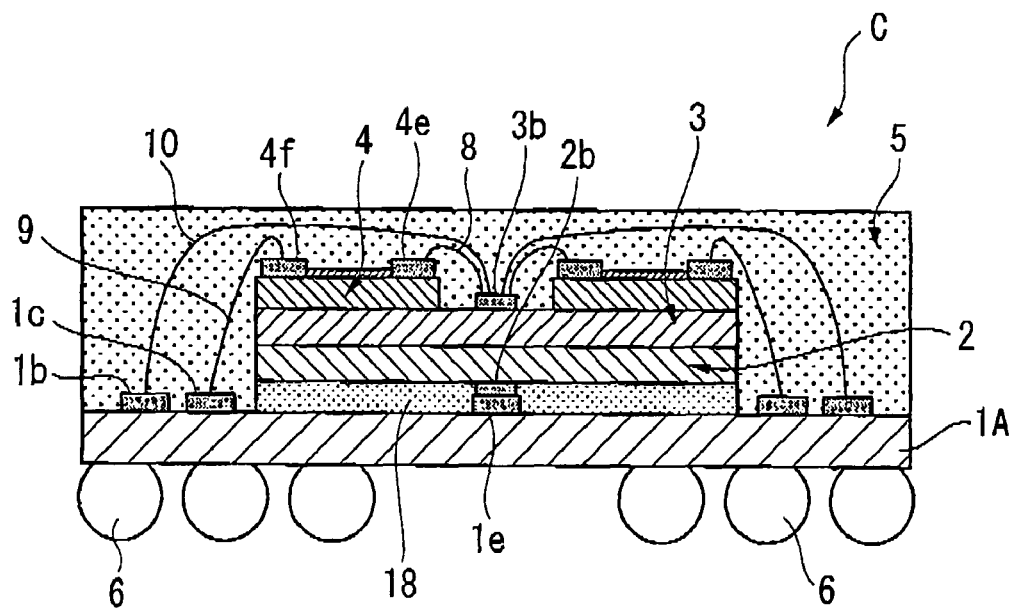
FIG. 10 is a longitudinal sectional view showing a third embodiment of the semiconductor stack package of the present invention.

FIG. 10 shows a third embodiment of the present invention. As shown in FIG. 10, a semiconductor stack package C of the present embodiment has a flip-chip mounting structure, in which the first semiconductor chip 2 is disposed in a face-down manner, that is, the circuit face (on which the pads 2b are provided) faces a first printed wiring board 1A, and the pads 2b are directly connected to corresponding connection lands 1e, which are formed at the relevant center of the first printed wiring board 1A. An insulating resin layer 18 (i.e., an insulating layer) is provided around the pads 2b and the connection lands 1e, that is, between the first printed wiring board 1A and the first semiconductor chip 2. Similar effects to those obtained by the previous embodiments can be obtained by the structure of the present embodiment.

In FIG. 10, the other parts are identical to the corresponding parts of the semiconductor stack package A of the first embodiment.

Figure 11:
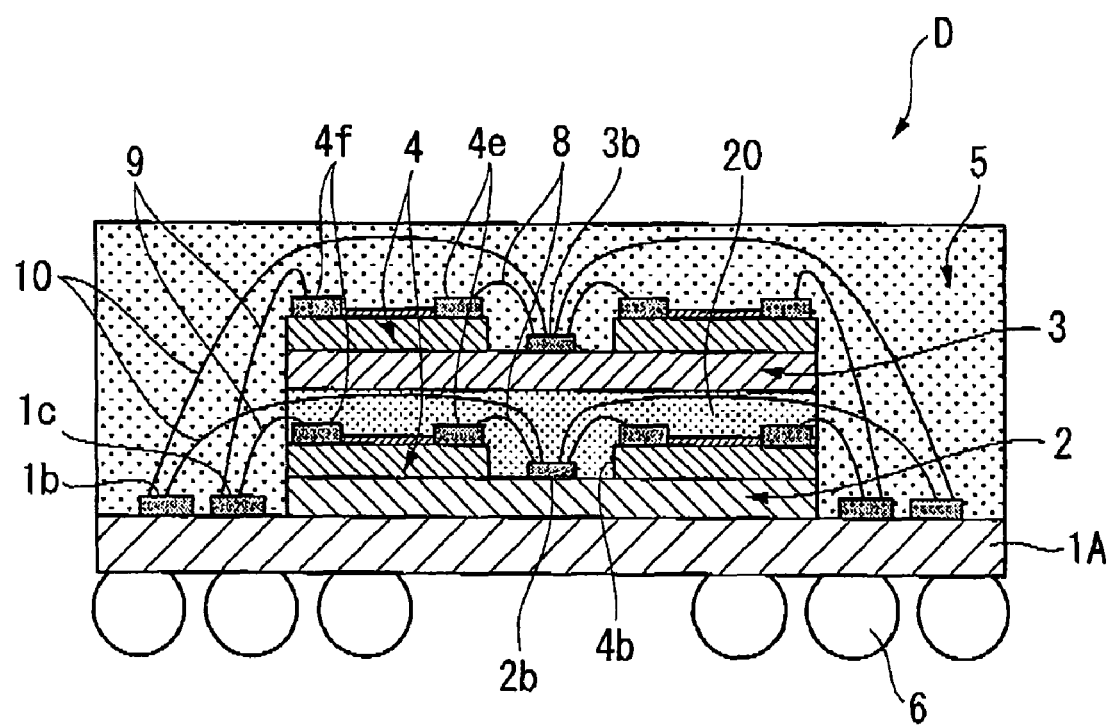
FIG. 11 is a longitudinal sectional view showing a fourth embodiment of the semiconductor stack package of the present invention.

FIG. 11 shows a fourth embodiment of the present invention. As shown in FIG. 11, in a semiconductor stack package D of the present embodiment, the first semiconductor chip 2 is disposed on the first printed wiring board 1A in a face-up manner, that is, the circuit face (on which the pads 2b are provided) faces upward, and the wiring extension part 4, on which only wiring circuits for power supply and grounding are provided, is stacked on the first semiconductor chip 2. The short wires 8 are connected between the electrode pads 2b for power supply and grounding of the first semiconductor chip 2 and the connection lands 4e which are provided on the wiring extension part 4, on which only the wiring circuits for power supply and grounding are formed. In addition, the wires 10 are connected between the pads 2b for signal transmission of the first semiconductor chip 2 and the connection lands 1b of the first printed wiring board 1, via the wiring hole 4b of the wiring extension part 4.

Additionally, the short wires 9 are connected between the connection lands 4f provided on the relevant end of the wiring extension part 4 and the corresponding connection lands 1c of the first printed wiring board 1.

Next, an insulating adhesive 20 (as an insulating layer, e.g., epoxy resin) is supplied to the circuit face of the first semiconductor chip 2 so that the wires 10 are embedded therein. Then the second semiconductor chip 3 is stacked on the insulating adhesive 20, and the insulating adhesive 20 is cured.

In addition, another wiring extension part 4, on which only wiring circuits for power supply and grounding are formed, is further stacked on the second semiconductor chip 3, thereby producing similar effects to those of the previous embodiments.

In FIG. 11, the other parts are identical to the corresponding parts of each semiconductor stack package of the previous embodiments.

In each of the embodiments shown in FIGS. 1, 9, 10, and 11, if the wiring extension part 4, on which only wiring circuits for power supply and grounding are formed, is a double-sided substrate, then the width of each wiring circuit for power supply or grounding can be thicker. In addition, if each wiring circuit for power supply and each wiring extension part for grounding are separately formed in different layers, a lower effective inductance is obtained in comparison with mutual inductance between the wiring circuits for power supply and grounding, and thus it is more preferable.

Also in the structures shown in FIGS. 1, 9, 10, and 11, the wiring extension part 4, on which only wiring circuits for power supply and grounding are formed, can be formed in a manner such that some of the wiring circuits 4d1 (for power supply patterns) or 4d2 (for ground patterns) are combined (e.g., a solid pattern including all VDD patterns may be formed). In this case, it is possible to further reduce the relevant impedance.

Also in the embodiments shown in FIGS. 1, 9, 10, and 11, if the wiring extension part 4, on which only wiring circuits for power supply and grounding are formed, is formed in a manner such that the wiring circuits for power supply are combined with VDD and VDDQ, and the wiring circuits for grounding are combined with VSS and VSSQ, so as to form more larger solid wiring-circuit patterns, thereby further reducing the relevant impedance.

In an example other than the above-described embodiments of the present invention, instead of using the wiring extension part 4, wiring layers may be directly formed on a semiconductor chip by using a manufacturing method which employs wafer-level CSP (chip size package) for redistribution.

In the wafer-level CSP, after semiconductor chips are formed on a semiconductor wafer, the semiconductor wafer is subjected to formation of a redistribution layer which includes wiring layers, protection layers, connection lands, or the like, and then subjected to dicing so as to provide individual semiconductor chips.

Even when such a redistribution layer structure (as a wiring extension part), in which only circuit wiring lines for only power supply and grounding are formed, is employed instead of the wiring extension part 4 (i.e., second printed wiring board) formed only for power supply and grounding, the relevant impedance can also be reduced.

Figure 12A:
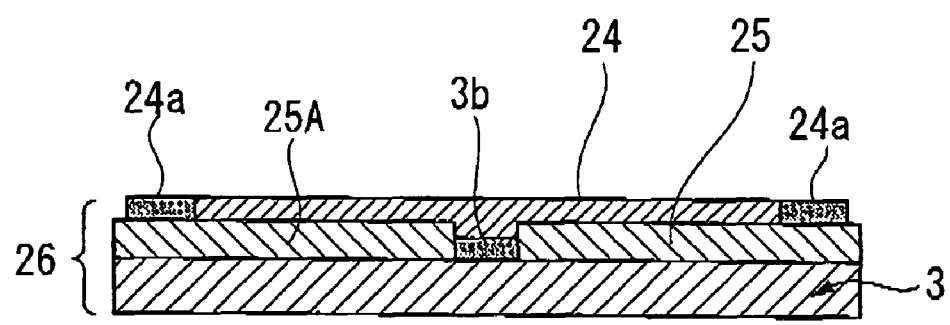
Figure 12B:
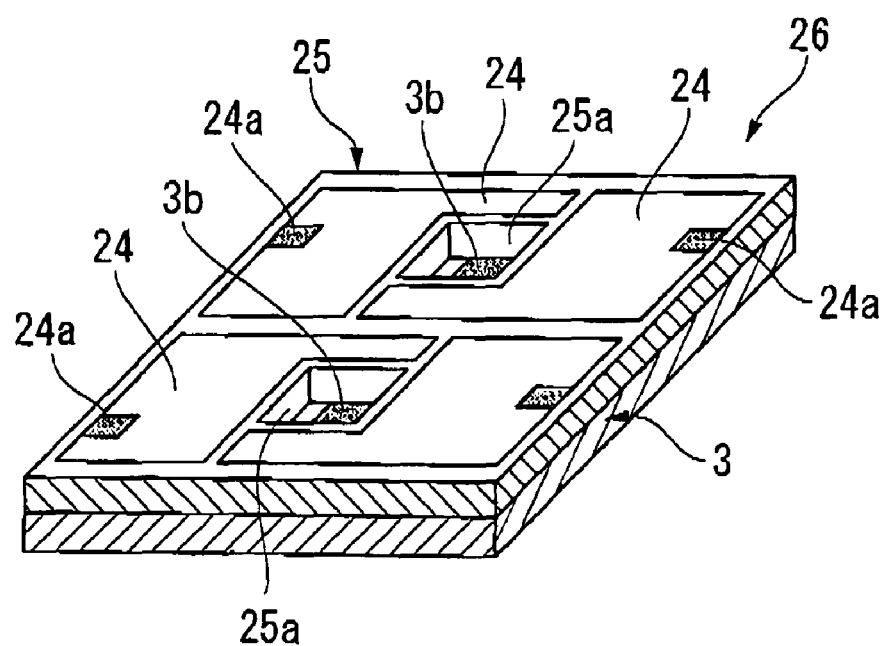

More specifically, in an example shown in FIGS. 12A and 12B, as a redistribution layer 25, the upper surface of the second semiconductor chip 3, except for an area where the pads 3b are formed, is covered with an insulating layer 25A, and a wiring layer 24 is provided for each of the pads 3b for power supply and grounding in a manner such that it extends from each pad 3b to the periphery of the semiconductor chip 3. At the periphery of the redistribution layer 25, a corresponding connection land 24a is provided.

In the example shown in FIGS. 12A and 12B, a plurality of wiring holes 25a are formed in the redistribution layer 25, and in each wiring hole 25a, each pad 3b for signal transmission of the second semiconductor chip 3 is provided. The structure, in which the redistribution layer 25 having the above form is disposed on the second semiconductor chip 3, is called as a "wafer-level CSP chip 26".

In the manufacturing method for this example, the second semiconductor chip 3 is subjected to a wafer-level CSP manufacturing process instead of the above-described process shown in FIG. 4, so as to form the wafer-level CSP chip 26 which has only wiring layers 24 for power supply and grounding (see FIG. 12A). In addition, the electrode pads 3b for signal transmission of the second semiconductor chip 3 are arranged at each position where the wiring hole 25a is formed by partially removing the redistribution layer 25. FIG. 12A is a sectional view showing the above structure, and FIG. 12B is a corresponding view observed from an upper-oblique direction.

Figure 13A:
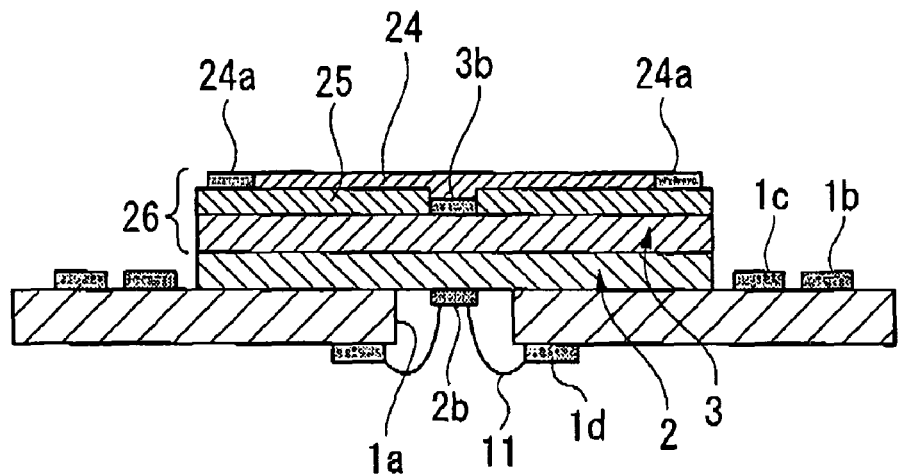
Figure 13B:
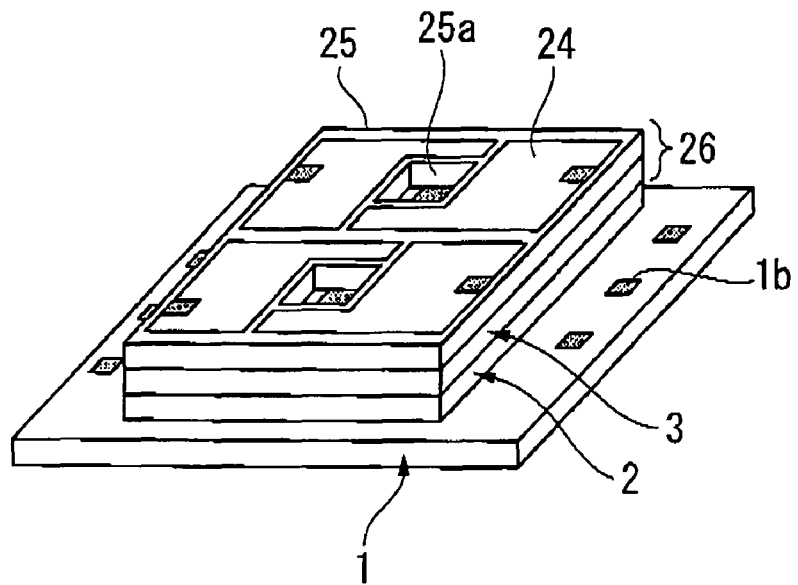

Next, as shown in FIGS. 13A and 13B, on the first semiconductor chip 2 (i.e., the face opposite to the circuit face), an insulating adhesive (not shown, e.g., epoxy resin or an elastomer material) is provided, and the above wafer-level CSP chip 26 is disposed thereon in a manner such that the second semiconductor chip 3 faces downward. The insulating adhesive is then cured, so that the first semiconductor chip 2 and the wafer-level CSP chip 26 are adhered to each other. FIG. 13A is a sectional view showing this state, and FIG. 13B is a corresponding view observed from an upper-oblique direction.

Figure 14A:
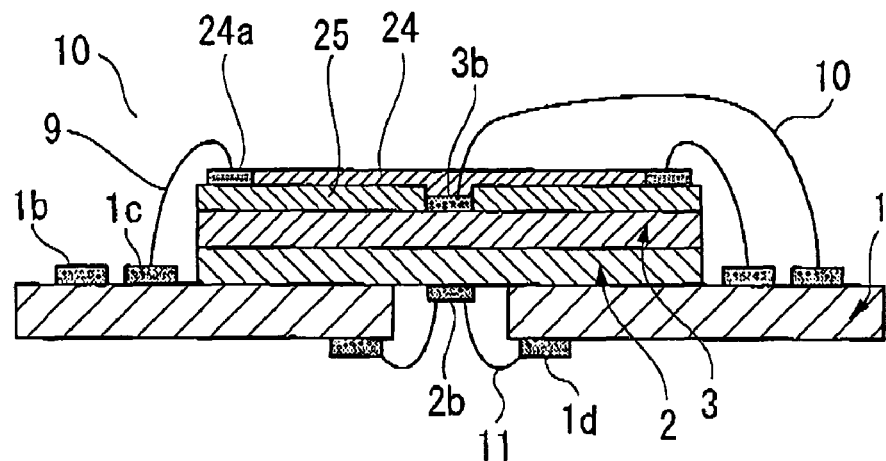
Figure 14B:
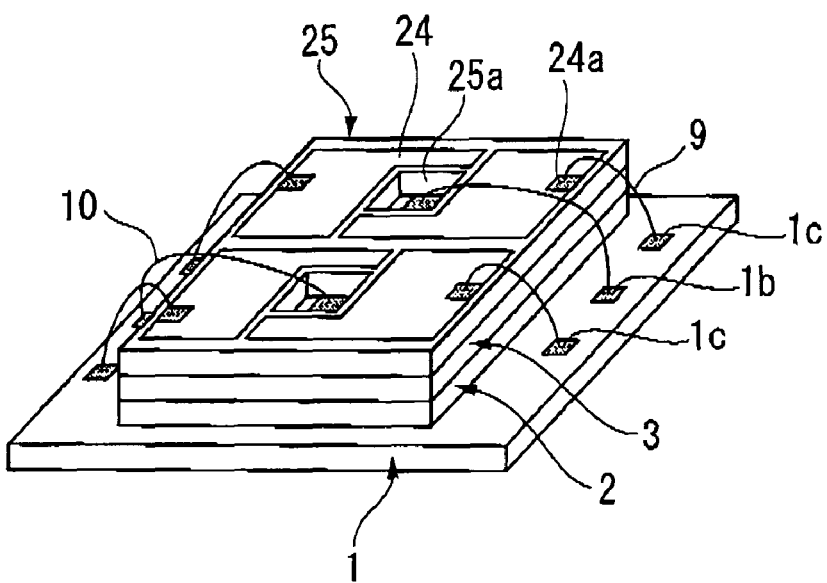
Figure 15:
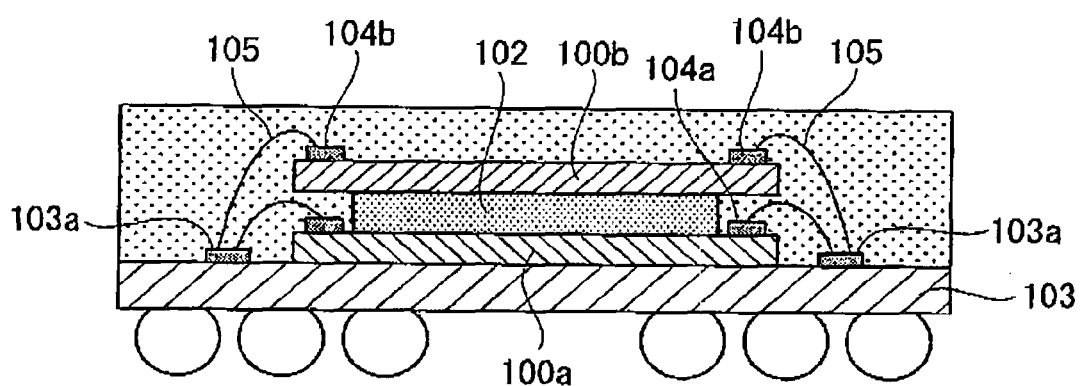
FIG. 15 is a sectional view showing an example of conventional semiconductor stack packages.
Figure 16A:
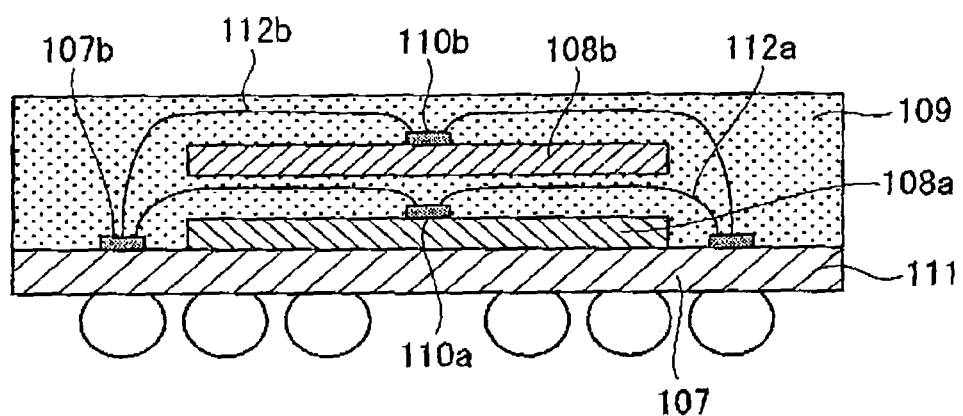
FIG. 16A is a sectional view showing an example of conventional structures, in which two semiconductor chips are stacked.
Figure 16B:
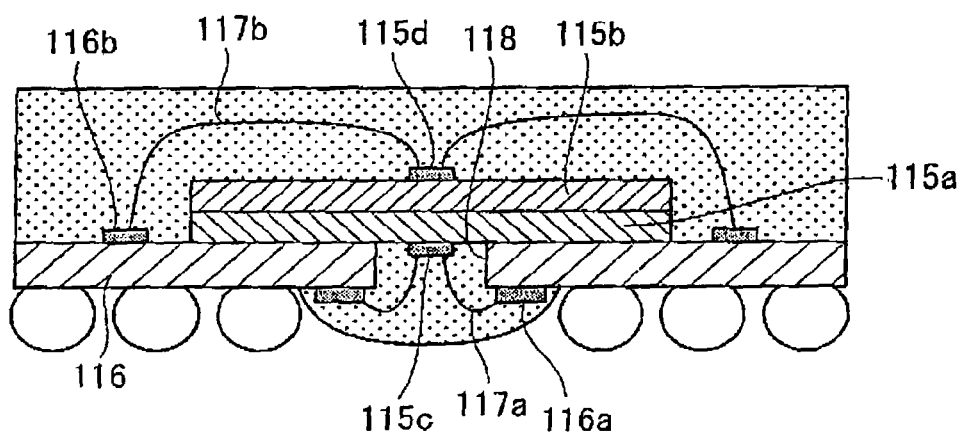
FIG. 16B is a sectional view showing another example in which two semiconductor chips are stacked.

Next, as shown in FIGS. 14A and 14B, the wires 10, which may be made of Au, are connected by means of wire bonding, between the electrode pads 3b for signal transmission of the second semiconductor chip 3 and the connection lands 1b of the first printed wiring board 1, via the wiring hole 25a of the redistribution layer 25 (on which only the wiring circuits for power supply and grounding are formed) by means of wire bonding. Here, the wires 10 pass above and beside the second semiconductor chip 3.

In addition, the wires 9, which may be made of Au, are connected between the connection lands 24a, which are provided at the relevant ends of the redistribution layer 25, and the connection lands 1c of the first printed wiring board 1, by means of wire bonding. FIG. 14A is a sectional view showing this state, and FIG. 14B is a corresponding view observed from an upper-oblique direction.

When employing such a redistribution layer 25 (of wafer-level CSP) in which only circuit wiring lines for power supply and grounding are formed, instead of the wiring extension part 4 on which only wiring circuits for power supply and grounding are formed, then the wires 8 provided in the previous embodiments are replaced with the wiring layers 24, thereby further reducing the relevant impedance.

With respect to the third embodiment shown in FIG. 10, similar effects can be obtained when the wiring extension part 4 (i.e., second printed wiring board), in which only wiring circuits for power supply and grounding are formed, is replaced with the above-described redistribution layer 25 of the wafer-level CSP, in which only circuit wiring lines for power supply and grounding are formed.

With respect to the fourth embodiment shown in FIG. 11, similar effects can be obtained when each wiring extension part 4 (i.e., second printed wiring board), which includes only wiring circuits for power supply and grounding and is stacked on both the first semiconductor chip 2 and the second semiconductor chip 3, is replaced with the above-described redistribution layer 25 of the wafer-level CSP, in which only circuit wiring lines for power supply and grounding are formed.

While preferred embodiments of the present invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

The present invention can be generally applied to semiconductor stack packages using various types of semiconductor chips, such as general-purpose DRAMs, in which electrode pads or pads for grounding are provided at the center of the chip, and such a DRAM can be an application example of the semiconductor stack package of the present invention. The semiconductor stack package of the present invention can also be widely applied to other stack structures using semiconductor chips, such as a data processor or a ROM (read only memory).

What is claimed is:

1. A semiconductor stack package comprising:
    a first printed wiring board;
    a plurality of semiconductor chips stacked on the first printed wiring board, including first and second semiconductor chips, the second semiconductor chip comprising an uppermost semiconductor chip which has an electrode pad for providing power supply, a ground pad for providing grounding, and a signal pad for signal transmission in a center area on the upper surface of the chip;
    connection lands formed on the first printed wiring board on the outside of the stacked semiconductor chips;
    a wiring extension part which is formed on the uppermost semiconductor chip, and has wiring circuits extending from the center to the periphery thereof, wherein at least one of the electrode pad and the ground pad is electrically connected to one end of one of the wiring circuits; and
    a wire for connecting the other end of the relevant wiring circuit of the wiring extension part and one of the connection lands on the first printed wiring board, the wiring circuit comprising a conductive layer having a width which is greater than a diameter of the wire.

2. The semiconductor stack package in accordance with claim 1, wherein:
    the wiring extension part has a wiring hole in a center area thereof.

3. The semiconductor stack package in accordance with claim 2, wherein:
    the electrode pad and the ground pad of the uppermost semiconductor chip are each connected to the center side of one of the wiring circuits via a wire, which passes through the wiring hole, by means of bonding.

4. The semiconductor stack package in accordance with claim 1, wherein:
    the wiring extension part comprises a second printed wiring board which has a substrate, the wiring hole being provided in a center area of the substrate, and the wiring circuits extending from the wiring hole to the periphery of the substrate.

5. The semiconductor stack package in accordance with claim 1, wherein:
    the wiring extension part has an insulating layer, wiring layers, and connection lands, which are deposited on the uppermost semiconductor chip, so that the wiring extension part is integrally formed on the uppermost semiconductor chip and the uppermost semiconductor chip functions as a chip size package.

6. The semiconductor stack package in accordance with claim 1, wherein:
    the first semiconductor chip has an electrode pad for providing power supply, a ground pad for providing grounding, and a signal pad for signal transmission, where the pads are provided on a center part of one face thereof, and the other face forms a flat part; and
    the first and second semiconductor chips are stacked on the first printed wiring board in a manner such that the second semiconductor chip functions as the uppermost semiconductor chip.

7. The semiconductor stack package in accordance with claim 6, wherein:
    the first printed wiring board has a wiring connection hole;
    the first semiconductor chip is stacked on the first printed wiring board in a manner such that the electrode pad, the ground pad, and the signal pad, which are provided on the center part of the one face of the first semiconductor chip, are contained in the wiring connection hole; and
    the second semiconductor chip is stacked on the first semiconductor chip in a manner such that the flat parts of the first and second semiconductor chips face each other.

8. The semiconductor stack package in accordance with claim 7, wherein:
    on the back face of the first printed wiring board, a connection land is provided in the vicinity of the wiring connection hole; and
    at least one of the electrode pad, the ground pad, and the signal pad of the first semiconductor chip, which are contained in the wiring connection hole, is connected to the connection land in the vicinity of the wiring connection hole, via a wire by means of bonding.

9. The semiconductor stack package in accordance with claim 2, wherein:
the signal pad of the uppermost semiconductor chip is connected to one of the connection lands on the first printed wiring board via a wire by means of bonding, where the wire passes above and beside the wiring extension part and the wiring hole thereof.

10. The semiconductor stack package in accordance with claim 8, wherein:
on the back face of the first printed wiring board, conductive elements are provided and electrically connected to the connection lands which are formed on the front face of the printed wiring board and on the outside of the stacked semiconductor chips.

11. The semiconductor stack package in accordance with claim 10, wherein:
the conductive elements are solder balls.

12. The semiconductor stack package in accordance with claim 8, wherein:
the connection land on the first printed wiring board, which is provided in the vicinity of the wiring connection hole, and the wire connected to this connection land are covered with a sealing material.

13. The semiconductor stack package in accordance with claim 1, wherein:
on the front face of the first printed wiring board, a sealing part is provided so as to cover the connection lands on the first printed wiring board, the semiconductor chips stacked on the first printed wiring board, the wiring extension part, and the wires connected therebetween by means of bonding.

14. The semiconductor stack package in accordance with claim 1, wherein:
the wiring extension part is provided via an insulating layer on the uppermost semiconductor chip; and
the signal pad of the uppermost semiconductor chip is connected to one of the connection lands on the first printed wiring board via a wire which passes through the insulating layer and extends along the side of the uppermost semiconductor chip.

15. The semiconductor stack package in accordance with claim 1, wherein:
the first semiconductor chip comprises a face on which pads are formed, and which faces the first printed wiring board, and the pads are connected to connection lands provided on the first printed wiring board; and
the a second semiconductor chip, which functions as the uppermost semiconductor chip, is stacked on the first semiconductor chip.

16. The semiconductor stack package in accordance with claim 1, further comprising:
another wiring extension part formed on the first semiconductor chip which is positioned lower than the uppermost semiconductor chip, wherein said another wiring extension part has wiring circuits extending from the center to the periphery thereof, at least one of the electrode pad and the ground pad of the first semiconductor chip being electrically connected to one end of one of the wiring circuits; and
a wire for connecting the other end of the relevant wiring circuit of said another wiring extension part and one of the connection lands on the first printed wiring board, wherein:
the uppermost semiconductor chip is stacked on the first semiconductor chip via an insulating layer which is formed on said another wiring extension part.

17. A semiconductor stack package comprising:
a first printed wiring board;
a plurality of semiconductor chips stacked on the first printed wiring board, including first and second semiconductor chips, the second semiconductor chip comprising an uppermost semiconductor chip which has an electrode pad for providing power supply, a ground pad for providing grounding, and a signal pad for signal transmission in a center area on the upper surface of the chip;
connection lands formed on the first printed wiring board on the outside of the stacked semiconductor chips;
a wiring extension part which is formed on the uppermost semiconductor chip, and has wiring circuits extending from the center to the periphery thereof, wherein at least one of the electrode pad and the ground pad is electrically connected to one end of one of the wiring circuits; and
a wire for connecting the other end of the relevant wiring circuit of the wiring extension part and one of the connection lands on the first printed wiring board, the wiring circuit comprising a conductive layer having a width which is greater than a diameter of the wire; wherein:
the electrode pad and the ground pad of the uppermost semiconductor chip are each connected to the center side of one of the wiring circuits via a wire, which passes through a wiring hole in the wiring extension part, by means of bonding;
the wiring extension part comprises a second printed wiring board which includes a substrate, the wiring hole being provided in a center area of the substrate, and the wiring circuits extending from the wiring hole to a periphery of the substrate;
the first semiconductor chip comprises an electrode pad for providing power supply, a ground pad for providing grounding, and a signal pad for signal transmission, where the pads are provided on a center part of one face thereof, and the other face forms a flat part;
the first and second semiconductor chips are stacked on the first printed wiring board in a manner such that the second semiconductor chip functions as the uppermost semiconductor chip;
the signal pad of the uppermost semiconductor chip is connected to one of the connection lands on the first printed wiring board via a wire by means of bonding, where the wire passes above and beside the wiring extension part and into the wiring hole of the wiring extension part;
on the back face of the first printed wiring board, conductive elements are provided and electrically connected to the connection lands which are formed on the front face of the printed wiring board and on the outside of the stacked semiconductor chips;
on the front face of the first printed wiring board, a sealing part is provided so as to cover the connection lands on the first printed wiring board, the semiconductor chips stacked on the first printed wiring board, the wiring extension part, and the wires connected therebetween by means of bonding;
the semiconductor stack package further comprises:
another wiring extension part formed on the first semiconductor chip which is positioned lower than the uppermost semiconductor chip, wherein said another wiring extension part has wiring circuits extending from the center to the periphery thereof, at least one of the electrode pad and the ground pad of the first semiconductor chip being electrically connected to one end of one of the wiring circuits; and a wire for connecting the other end of the relevant wiring circuit of said another wiring extension part and one of the connection lands on the first printed wiring board, and;

the uppermost semiconductor chip is stacked on the first semiconductor chip via an insulating layer which is formed on said another wiring extension part.

18. A semiconductor stack package comprising:

a first printed wiring board;

a plurality of semiconductor chips stacked on the first printed wiring board, including first and second semiconductor chips, the second semiconductor chip comprising an uppermost semiconductor chip which has an electrode pad for providing power supply, a ground pad for providing grounding, and a signal pad for signal transmission, the pads being provided in a center area on a face of the chip, and an other face of the chip comprising a flat part;

connection lands formed on the first printed wiring board on the outside of the stacked semiconductor chips;

a wiring extension part which is formed on the uppermost semiconductor chip, and has wiring circuits extending from the center to the periphery thereof, wherein at least one of the electrode pad and the ground pad is electrically connected to one end of one of the wiring circuits; and a wire for connecting the other end of the relevant wiring circuit of the wiring extension part and one of the connection lands on the first printed wiring board, the wiring circuit comprising conductive layer having a width which is greater than a diameter of the wire; wherein:

the electrode pad and the ground pad of the uppermost semiconductor chip are each connected to the center side of one of the wiring circuits via a wire, which passes through a wiring hole in the wiring extension part, by means of bonding;

the wiring extension part comprises a second printed wiring board which includes a substrate, the wiring hole being provided in a center area of the substrate, and the wiring circuits extending from the wiring hole to a periphery of the substrate;

the first semiconductor chip comprises an electrode pad for providing power supply, a ground pad for providing grounding, and a signal pad for signal transmission, where the pads are provided on a center part of one face thereof, and the other face forms a flat part;

the first and second semiconductor chips are stacked on the first printed wiring board in a manner such that the second semiconductor chip functions as the uppermost semiconductor chip;

the first printed wiring board has a wiring connection hole;

the first semiconductor chip is stacked on the first printed wiring board in a manner such that the electrode pad, the ground pad, and the signal pad, which are provided on the center part of the one face of the first semiconductor chip, are contained in the wiring connection hole;

the second semiconductor chip is stacked on the first semiconductor chip in a manner such that the flat parts of the first and second semiconductor chips face each other;

on the back face of the first printed wiring board, a connection land is provided in the vicinity of the wiring connection hole;

at least one of the electrode pad, the ground pad, and the signal pad of the first semiconductor chip, which are contained in the wiring connection hole, is connected to the connection land in the vicinity of the wiring connection hole, via a wire by means of bonding;

the signal pad of the uppermost semiconductor chip is connected to one of the connection lands on the first printed wiring board via wire bonding by one of;

a wire which passes above and beside the wiring extension part and into the wiring hole of the wiring extension part; and a wire which passes through an insulating layer formed between the wiring extension part and the uppermost semiconductor chip and extends along the side of the uppermost semiconductor chip:

on the back face of the first printed wiring board, conductive elements are provided and electrically connected to the connection lands which are formed on the front face of the printed wiring board and on the outside of the stacked semiconductor chips; and on the front face of the first printed wiring board, a sealing part is provided so as to cover the connection lands on the first printed wiring board, the semiconductor chips stacked on the first printed wiring board, the wiring extension part, and the wires connected therebetween by means of bonding.

* * * * *